US011142313B2

(12) United States Patent
Yu et al.

(10) Patent No.: US 11,142,313 B2
(45) Date of Patent: Oct. 12, 2021

(54) FLIGHT CONTROL DEVICE AND UNMANNED AERIAL VEHICLE HAVING THE SAME

(71) Applicant: SZ DJI TECHNOLOGY CO., LTD., Shenzhen (CN)

(72) Inventors: Yun Yu, Shenzhen (CN); Yin Tang, Shenzhen (CN); Yonggen Wang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 783 days.

(21) Appl. No.: 15/964,997

(22) Filed: Apr. 27, 2018

(65) Prior Publication Data

US 2018/0244388 A1  Aug. 30, 2018

Related U.S. Application Data

(63) Continuation of application No. PCT/CN2015/093285, filed on Oct. 30, 2015.

(51) Int. Cl.
*B64C 39/00* (2006.01)
*B64C 39/02* (2006.01)
(Continued)

(52) U.S. Cl.
CPC .......... *B64C 39/024* (2013.01); *H05K 5/03* (2013.01); *H05K 7/1427* (2013.01); *H05K 7/2089* (2013.01); *H05K 7/20145* (2013.01); *H05K 7/20863* (2013.01); *B64C 2201/14* (2013.01); *B64C 2201/141* (2013.01); *H05K 2201/10* (2013.01)

(58) Field of Classification Search
CPC ............ B64C 39/024; B64C 2201/14; B64C 2201/141; H05K 7/2089; H05K 7/1427; H05K 7/20145; H05K 7/20863; H05K 5/03; H05K 2201/10
USPC ........................................................ 361/688
See application file for complete search history.

(56) References Cited

U.S. PATENT DOCUMENTS 10,054,939 B1 * 8/2018 Applewhite .......... B64C 39/024
2010/0271199 A1 * 10/2010 Belov .................. G01M 5/0008
340/539.3
(Continued)

FOREIGN PATENT DOCUMENTS

CN  201904727 U  7/2011
CN  102201027 A  9/2011
(Continued)

OTHER PUBLICATIONS

The World Intellectual Property Organization (WIPO) International Search Report for PCT/CN2015/093285 dated Aug. 4, 2016 7 Pages (including translation).

*Primary Examiner* — Anatoly Vortman
*Assistant Examiner* — Zhengfu J Feng
(74) *Attorney, Agent, or Firm* — Anova Law Group, PLLC (57) ABSTRACT

A flight control device includes a housing, a main control board provided in the housing, an inertial measurement unit provided in the housing and electrically connected to the main control board, and a power management unit provided at the housing and electrically connected to the main control board. The main control board, the inertial measurement unit, and the power management unit are fixedly connected to and integrated with the housing as a whole.

14 Claims, 5 Drawing Sheets

(51) Int. Cl.
*H05K 7/20* (2006.01)
*H05K 5/03* (2006.01)
*H05K 7/14* (2006.01)

(56) References Cited

U.S. PATENT DOCUMENTS

| | | | |
|---|---|---|---|
| 2012/0083945 A1* | 4/2012 | Oakley | B64C 25/52 |
| | | | 701/2 |
| 2012/0169484 A1 | 7/2012 | Roehr | |
| 2014/0160655 A1* | 6/2014 | Yebka | H01M 50/209 |
| | | | 361/679.21 |
| 2014/0297067 A1* | 10/2014 | Malay | G05D 1/106 |
| | | | 701/4 |
| 2016/0130015 A1* | 5/2016 | Caubel | B64C 27/001 |
| | | | 244/120 |
| 2016/0221683 A1* | 8/2016 | Roberts | B64D 27/02 |
| 2016/0327950 A1* | 11/2016 | Bachrach | G05D 1/0094 |
| 2016/0376000 A1* | 12/2016 | Kohstall | B63G 8/08 |
| | | | 114/313 |
| 2016/0376004 A1* | 12/2016 | Claridge | B64C 27/08 |
| | | | 701/3 |
| 2018/0203492 A1* | 7/2018 | Huang | H05K 7/20436 |

FOREIGN PATENT DOCUMENTS

| | | |
|---|---|---|
| CN | 102431643 A | 5/2012 |
| CN | 202229682 U | 5/2012 |
| CN | 203747200 U | 7/2014 |
| CN | 203870472 U | 10/2014 |
| CN | 204102046 U | 1/2015 |
| CN | 104627361 A | 5/2015 |
| CN | 104833821 A | 8/2015 |
| CN | 104931052 A | 9/2015 |
| CN | 204726664 U | 10/2015 |
| CN | 205168871 U | 4/2016 |

* cited by examiner

FLIGHT CONTROL DEVICE AND UNMANNED AERIAL VEHICLE HAVING THE SAME

CROSS-REFERENCE TO RELATED APPLICATION

This is a continuation application of International Application No. PCT/CN2015/093285, filed on Oct. 30, 2015, the entire contents of which are incorporated herein by reference.

TECHNICAL FIELD

The disclosure relates to electronic systems used on aircraft, and more particularly to a flight control device and an unmanned aerial vehicle (UAV) having the flight control device.

BACKGROUND OF THE DISCLOSURE

An existing flight controller system can comprise separate components such as an inertial measurement unit (IMU), a power management unit (PMU) and a main controller. The separate components may exhaust a limited internal space of an aerial vehicle and put strict requirements on a connection stability of controller area network (CAN) interfaces of the aerial vehicle. The cumbersome configuration and complicated interfaces of the flight controller system having separate components makes it inconvenient to install and use. A system reliability can be lowered due to a risk of incorrect wiring between various functional modules. In addition, the flight controller system having separate components has a limited number of interfaces and lowered system expandability, thus is not suitable for complicated applications where various functionalities are demanded.

SUMMARY OF THE DISCLOSURE

There is a need to provide a flight control device and an unmanned aerial vehicle having the flight control device to address the prior art problems.

A flight control device can comprise: a housing; a main control board provided in the housing and configured to support one or more electronic components; an inertial measurement unit provided in the housing and electrically connected to the main control board; and a power management unit provided on the housing and electrically connected to the main control board. In some embodiments, the main control board, the inertial measurement unit and the power management unit can be fixedly connected and integrated with the housing.

In some embodiments, the housing can comprise a first cover and a second cover. The first cover and the second cover can mate with each other and can be detachably connected to each other to form an accommodating cavity between the first cover and the second cover for accommodating the main control board and the inertial measurement unit.

In some embodiments, a connecting hole can be provided at each of the first cover and the second cover. The connecting hole provided at the first cover can correspond to the connecting hole provided at the second cover. In some embodiments, the first cover and the second cover can be fixed together by fitting a connecting piece with the connecting holes. Alternatively, the first cover and the second cover can be fixed together through a snap fitting or using an adhesive.

In some embodiments, the first cover can be provided with a first mounting region, a shape of the first mounting region matching with a shape of the main control board. In some embodiments, the main control board can be fixed in the first mounting region.

In some embodiments, the first cover can be further provided with a second mounting region, a shape of the second mounting region matching with a shape of the inertial measurement unit. In some embodiments, the inertial measurement unit can be provided in the second mounting region.

In some embodiments, a stopper protruding from the first cover can be provided around the second mounting region to limit the inertial measurement unit within the second mounting region. In some embodiments, one side of the second cover facing the first cover can be provided with a receiving groove which corresponds to the second mounting region, the receiving groove forming a receiving cavity together with the stopper around the second mounting region to receive and fix the inertial measurement unit.

In some embodiments, the inertial measurement unit can be electrically connected to the main control board using a flexible circuit board.

In some embodiments, one side of the second cover which is distal from the first cover can be provided with a receiving portion, the receiving portion receiving the power management unit.

In some embodiments, the one or more electronic components supported on the main control board can comprise an electrical connector. In some embodiments, a through-hole corresponding to the electrical connector can be provided at the receiving portion. In some embodiments, a socket mated with the electrical connector can be provided on a side of the power management unit facing the receiving portion. In some embodiments, the socket of the power management unit can be electrically connected to the electrical connector via the through-hole, such that the power management unit is brought into electrical connection with the main control board.

In some embodiments, a flange can be provided at each one of two opposite ends of the power management unit, which flanges extending in a same direction. In some embodiments, the two flanges can be respectively mounted on two opposite sides of the receiving portion and detachably connected to the second cover.

In some embodiments, the flight control device can further comprise an air guidance plate. In some embodiments, the air guidance plate can be provided with a heat dissipation channel. In some embodiments, the air guidance plate can be mated with a surface of the housing and detachably connected to the housing.

In some embodiments, a receiving portion for receiving the power management unit can be provided on a surface of the housing. In some embodiments, a recess corresponding to the receiving portion can be provided at the air guidance plate. In some embodiments, an accommodating cavity for accommodating the power management unit can be formed by the recess of the air guidance plate and the receiving portion of the second cover. In some embodiments, the heat dissipation channel can be in communication with the accommodating cavity.

In some embodiments, a heat dissipation apparatus for dissipating a heat of the power management unit can be provided at the air guidance plate.

In some embodiments, the heat dissipation apparatus can comprise an axial fan. In some embodiments, the air guidance plate can be further provided with an air inlet, a mounting hole and an air outlet, the air inlet, the mounting hole, the heat dissipation channel and the air outlet being in communication with one another. In some embodiments, the heat dissipation apparatus can be mounted through the mounting hole. In some embodiments, the heat dissipation channel can run through the recess. In some embodiments, the air inlet and the air outlet can be respectively provided at two ends of the heat dissipation channel.

In some embodiments, the one or more electronic components supported on the main control board can comprise at least one functional extension interface. In some embodiments, the first cover and/or the second cover can be provided with an opening at a location corresponding to the at least one functional extension interface to expose the functional extension interface.

In some embodiments, the functional extension interface can comprise at least one of an SD card slot, a USB interface or a VGA interface.

An unmanned aerial vehicle can comprise: a body; and a flight control device mounted on the body. The flight control device can comprising: a housing; a main control board provided in the housing and configured to support one or more electronic components; an inertial measurement unit provided in the housing and electrically connected to the main control board; and a power management unit provided on the housing and electrically connected to the main control board. In some embodiments, the main control board, the inertial measurement unit and the power management unit can be fixedly connected and integrated with the housing.

In some embodiments, the housing can comprise a first cover and a second cover. The first cover and the second cover can mate with each other and can be detachably connected to each other to form an accommodating cavity between the first cover and the second cover for accommodating the main control board and the inertial measurement unit.

In some embodiments, a connecting hole can be provided at each of the first cover and the second cover. The connecting hole provided at the first cover can correspond to the connecting hole provided at the second cover. In some embodiments, the first cover and the second cover can be fixed together by fitting a connecting piece with the connecting holes. Alternatively, the first cover and the second cover can be fixed together through a snap fitting or using an adhesive.

In some embodiments, the first cover can be provided with a first mounting region, a shape of the first mounting region matching with a shape of the main control board. In some embodiments, the main control board can be fixed in the first mounting region.

In some embodiments, the first cover can be further provided with a second mounting region, a shape of the second mounting region matching with a shape of the inertial measurement unit. In some embodiments, the inertial measurement unit can be provided in the second mounting region.

In some embodiments, a stopper protruding from the first cover can be provided around the second mounting region to limit the inertial measurement unit within the second mounting region. In some embodiments, one side of the second cover facing the first cover can be provided with a receiving groove which corresponds to the second mounting region, the receiving groove forming a receiving cavity together with the stopper around the second mounting region to receive and fix the inertial measurement unit.

In some embodiments, the inertial measurement unit can be electrically connected to the main control board using a flexible circuit board.

In some embodiments, one side of the second cover which is distal from the first cover can be provided with a receiving portion, the receiving portion receiving the power management unit.

In some embodiments, the one or more electronic components supported on the main control board can comprise an electrical connector. In some embodiments, a through-hole corresponding to the electrical connector can be provided at the receiving portion. In some embodiments, a socket mated with the electrical connector can be provided on a side of the power management unit facing the receiving portion. In some embodiments, the socket of the power management unit can be electrically connected to the electrical connector via the through-hole, such that the power management unit is brought into electrical connection with the main control board.

In some embodiments, a flange can be provided at each one of two opposite ends of the power management unit, which flanges extending in a same direction. In some embodiments, the two flanges can be respectively mounted on two opposite sides of the receiving portion and detachably connected to the second cover.

In some embodiments, the flight control device can further comprise an air guidance plate. In some embodiments, the air guidance plate can be provided with a heat dissipation channel. In some embodiments, the air guidance plate can be mated with a surface of the housing and detachably connected to the housing.

In some embodiments, a receiving portion for receiving the power management unit can be provided on a surface of the housing. In some embodiments, a recess corresponding to the receiving portion can be provided at the air guidance plate. In some embodiments, an accommodating cavity for accommodating the power management unit can be formed by the recess of the air guidance plate and the receiving portion of the second cover. In some embodiments, the heat dissipation channel can be in communication with the accommodating cavity.

In some embodiments, a heat dissipation apparatus for dissipating a heat of the power management unit can be provided at the air guidance plate.

In some embodiments, the heat dissipation apparatus can comprise an axial fan. In some embodiments, the air guidance plate can be further provided with an air inlet, a mounting hole and an air outlet, the air inlet, the mounting hole, the heat dissipation channel and the air outlet being in communication with one another. In some embodiments, the heat dissipation apparatus can be mounted through the mounting hole. In some embodiments, the heat dissipation channel can run through the recess. In some embodiments, the air inlet and the air outlet can be respectively provided at two ends of the heat dissipation channel.

In some embodiments, the one or more electronic components supported on the main control board can comprise at least one functional extension interface. In some embodiments, the first cover and/or the second cover can be provided with an opening at a location corresponding to the at least one functional extension interface to expose the functional extension interface.

In some embodiments, the functional extension interface can comprise at least one of an SD card slot, a USB interface or a VGA interface.

The flight control device of the disclosure is advantageous in high system integration, compact configuration, improved system reliability and convenient redundancy expansion to address. The prior art problems including a complicated system configuration and low system expandability can be addressed.

LIST OF REFERENCE NUMERALS

TABLE 1

| | |
|---|---|
| Unmanned Aerial Vehicle | 100 |
| Flight Control Device | 20 |
| Housing | 21 |
| First Cover | 211 |
| First Mounting Region | 2111 |
| Second Mounting Region | 2112 |
| Stopper | 2113 |
| Second Cover | 212 |
| Receiving Groove | 2121 |
| Receiving portion | 2122 |
| Through-hole | 2123 |
| Opening | 2124 |
| Air guidance plate | 213 |
| Recess | 2130 |
| Air inlet | 2131 |
| Mounting hole | 2132 |
| Heat dissipation channel | 2133 |
| Air outlet | 2134 |
| Main control board | 22 |
| Electrical Connector | 221 |
| Functional extension interface | 222 |
| Power management unit | 23 |
| Socket | 231 |
| Flange | 232 |
| Inertial measurement unit | 24 |
| Flexible circuit board | 25 |
| Connecting hole | 261, 262, 271, 272, 273, 291, 292 |
| Connecting piece | 281, 282 |
| Body | 30 |

Illustrative embodiments of the present disclosure will be described in more detail with reference to the drawings.

DETAILED DESCRIPTION OF THE DISCLOSURE

A better understanding of the disclosure will be obtained by reference to the following detailed description that sets forth illustrative embodiments with reference to the drawings. It will be apparent that, the embodiments described herein are merely provided by way of example only. Those skilled in the art can conceive other embodiments in light of those embodiments disclosed herein without inventive efforts, and all these embodiments are within the scope of the disclosure.

Figure 1:
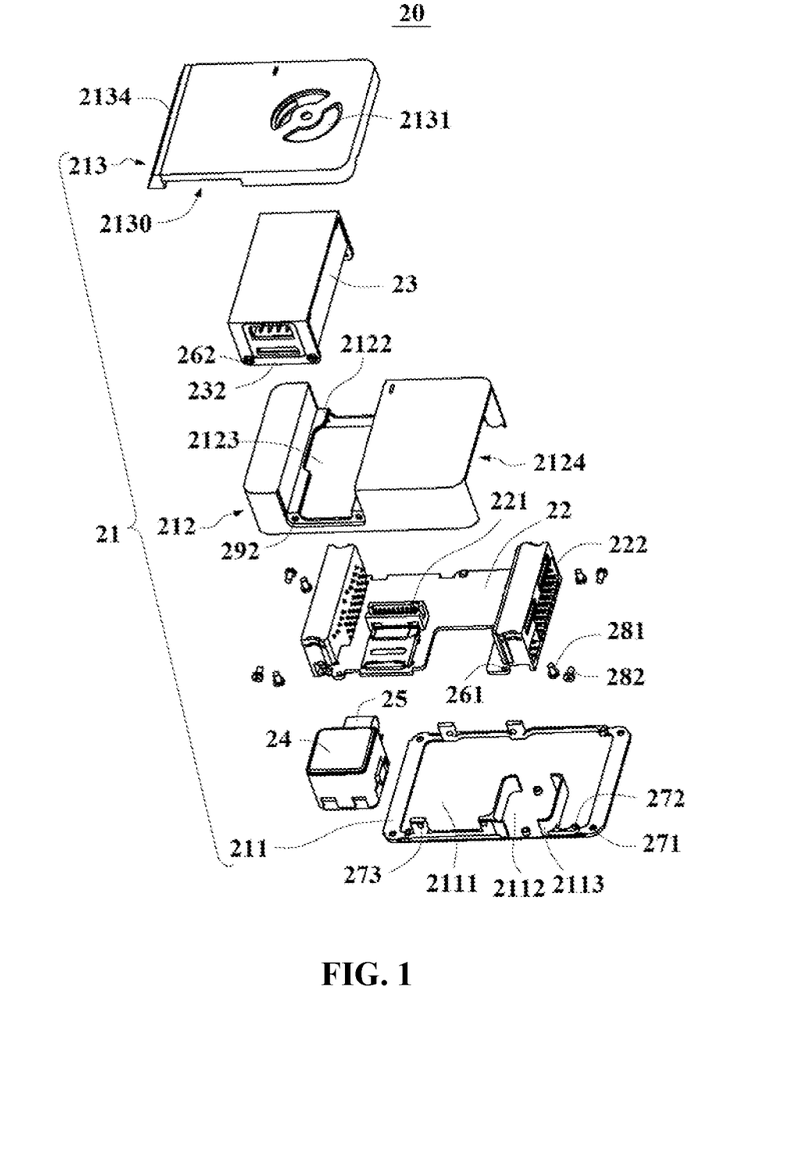
FIG. 1 is an exploded view of a configuration of a flight control device in accordance with embodiments of the disclosure.

FIG. 1 is an exploded view of a configuration of a flight control device 20 in accordance with embodiments of the disclosure. The flight control device 20 can comprise a housing 21, a main control board 22, a power management unit 23 and an inertial measurement unit 24. In some instances, the main control board 22 can be provided in the housing 21 and configured to support electronic components. The power management unit 23 can be provided on the housing 21 and electrically connected to the main control board 22. The inertial measurement unit 24 can be provided in the housing 21 and electrically connected to the main control board 22. In some embodiments, the main control board 22, the power management unit 23 and the inertial measurement unit 24 can be fixedly connected and integrated with the housing 21.

In some embodiments, the housing 21 can comprise a first cover 211 and a second cover 212. The first cover 211 and the second cover 212 can mate with one another and be detachably connected to each other, such that an accommodating cavity can be formed between the first cover 211 and the second cover 212 for accommodating the main control board 22 and the inertial measurement unit 24.

Figure 2:
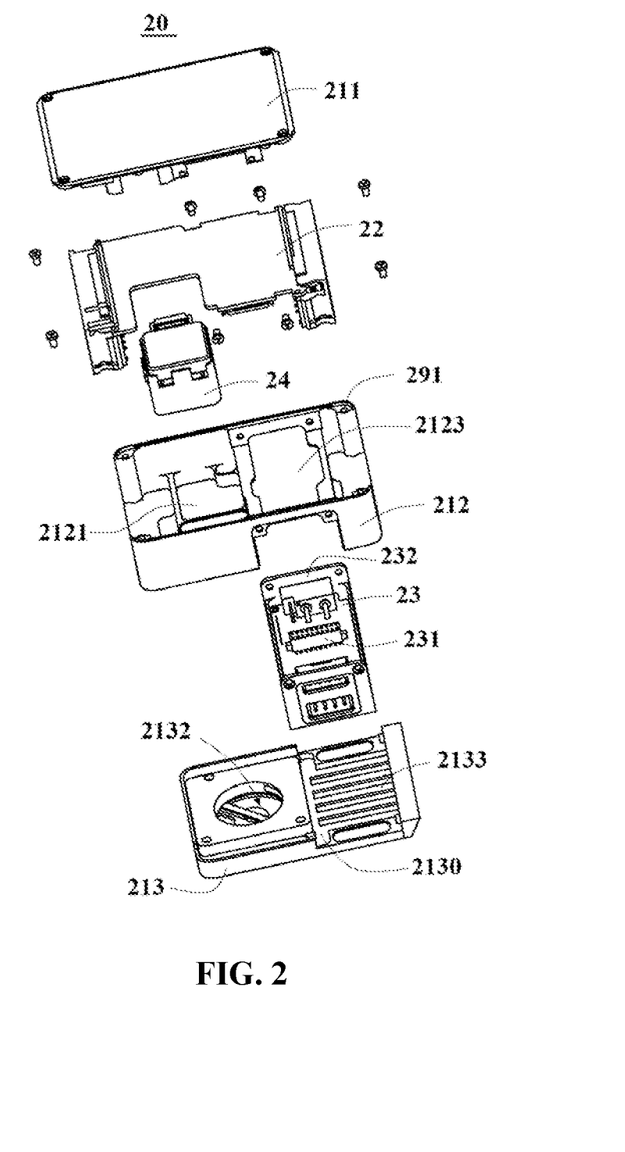
FIG. 2 is an exploded view of the configuration of the flight control device of FIG. 1 viewed from another direction.

In some embodiments, as also shown in FIG. 2, A connecting hole 271 can be provided at the first cover 211, and a connecting hole 291 can be provided at the second cover 212, the holes 271, 291 corresponding to one another. The first cover 211 and the second cover 212 can be fixed to each other by fitting a connecting piece 281 with the corresponding connecting holes 271, 291. In some instances, the connecting holes 271, 291 can each be a threaded hole, and the connecting piece 281 can be a screw. In alternative embodiments, the first cover 211 and the second cover 212 can be connected to each other through a snap fitting or using an adhesive.

In some embodiments, the first cover 211 can be provided with a first mounting region 2111. A shape of the first mounting region 2111 can match with a shape of the main control board 22, such that the main control board 22 can be fixed in the first mounting region 2111. In some embodiments, a connecting hole 261 can be provided at the main control board 22, and a connecting hole 272 can be provided at the first cover 211, the connecting holes 261, 272 corresponding to each another. The main control board 22 can be fixed in the first mounting region 2111 of the first cover 211 by fitting a connecting piece (not shown) with the opposing connecting holes 261, 272. In some instances, the connecting holes 261, 272 can each be a threaded hole, and the connecting piece can be a screw.

In some embodiments, the first cover 211 can be further provided with a second mounting region 2112. A shape of the second mounting region 2112 can match with a shape of the inertial measurement unit 24, such that the inertial measurement unit 24 can be provided in the second mounting region 2112. In some embodiments, a stopper 2113 protruding from the first cover 211 can be provided around the second mounting region 2112. The stopper 2113 can be used to limit the inertial measurement unit 24 within the second mounting region 2112.

In some embodiments, the inertial measurement unit 24 can be electrically connected to the main control board 22 using a flexible circuit board 25. For instance, as shown in FIG. 3, one end of the flexible circuit board 25 can be attached to the inertial measurement unit 24, and the other end can be attached to the main control board 22 and electrically connected to a printed circuit (not shown) on the main control board 22.

In some embodiments, as shown in FIG. 2, one side of the second cover 212 facing the first cover 211 can be provided with a receiving groove 2121 which corresponds to the second mounting region 2112. The receiving groove 2121 can be used to form a receiving cavity together with the air stopper 2113 around the second mounting region 2112. The receiving cavity can be configured to receive and fix the inertial measurement unit 24 to facilitate an installation and a removal of the inertial measurement unit 24 and to prevent the inertial measurement unit 24 from vibrating or dropping out of the receiving cavity.

Figure 3:
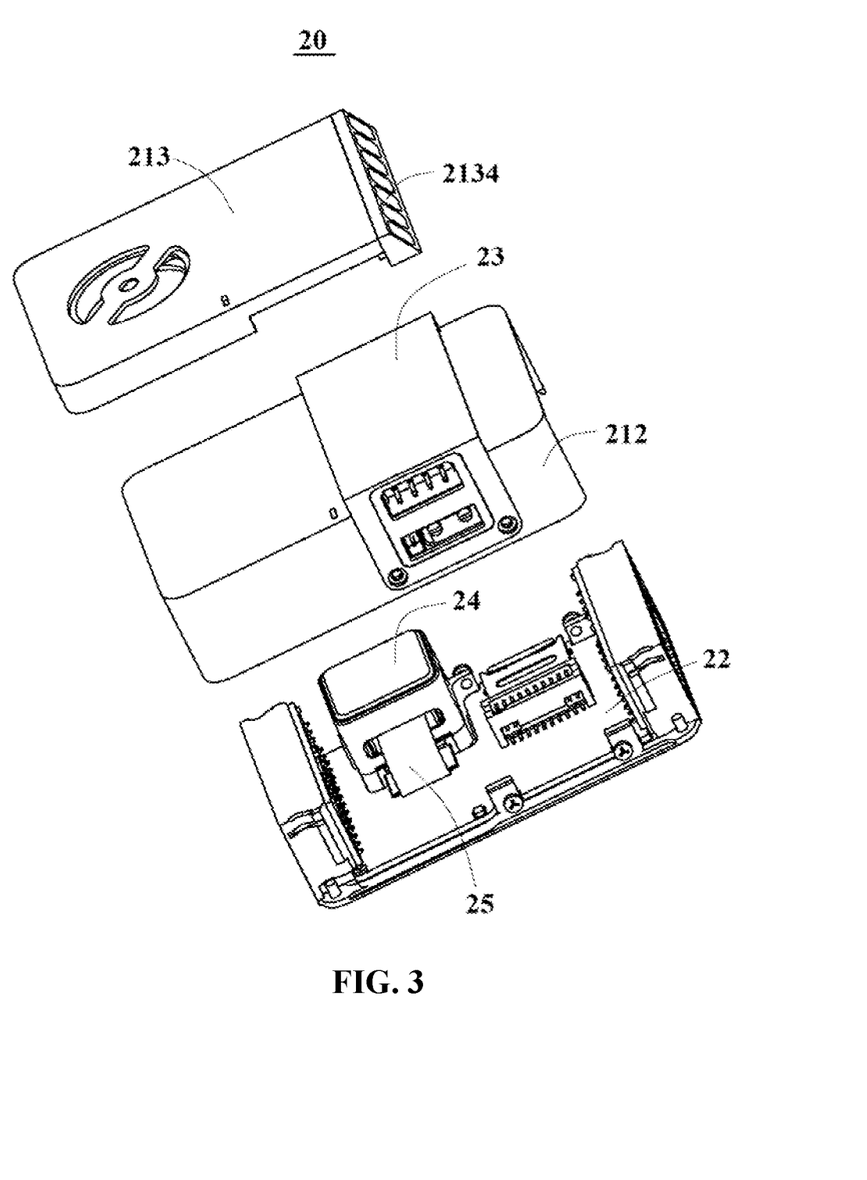
FIG. 3 is a partial exploded view of the configuration of the flight control device of FIG. 1.

Referring to FIGS. 1-2, in some embodiments, one side of the second cover 212 distal from the first cover 211 can be further provided with a receiving portion 2122 for receiving the power management unit 23 (as shown in FIG. 3).

Figure 4:
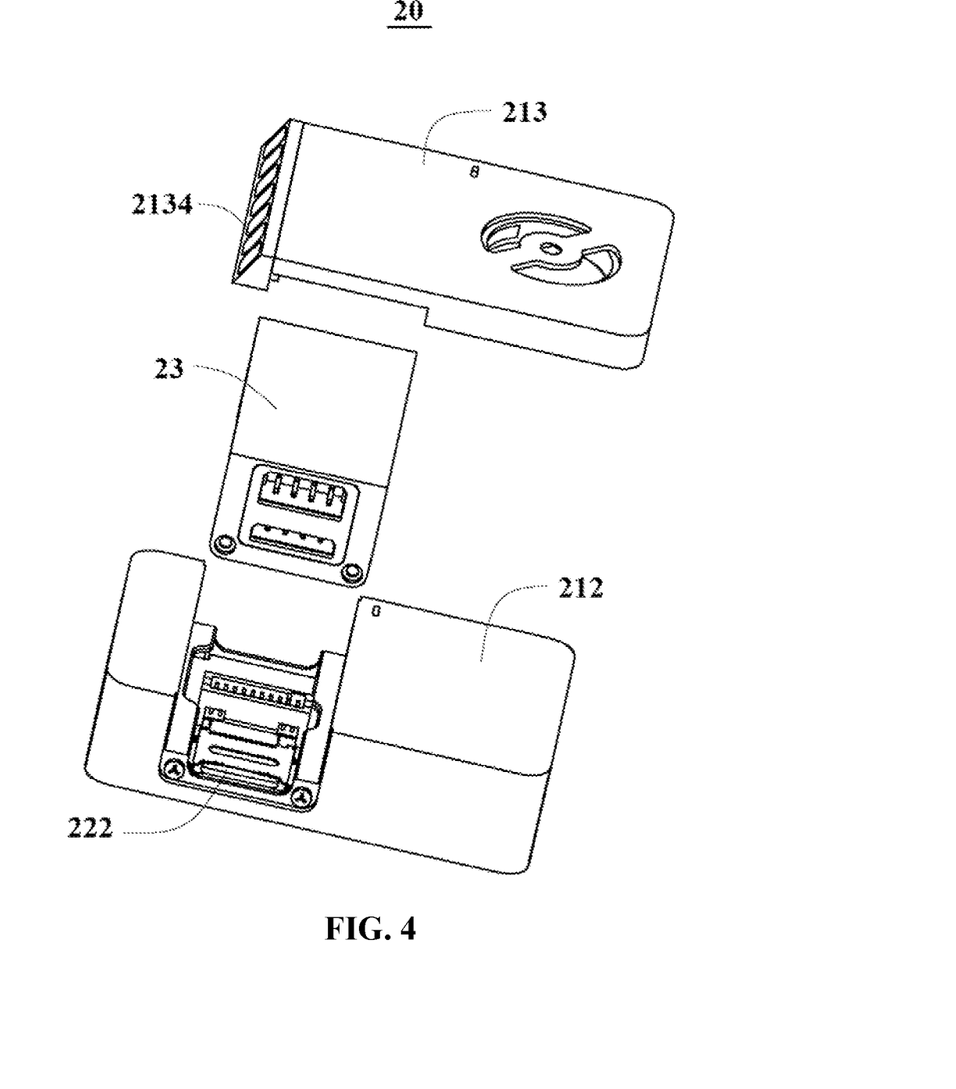
FIG. 4 is another partial exploded view of the configuration of the flight control device of FIG. 1.

In some embodiments, the electronic components supported on the main control board 22 can comprise an electrical connector 221. A through-hole 2123 corresponding to the electrical connector 221 can be provided at the receiving portion 2122. A socket 231 mated with the electrical connector 221 can be provided on a side of the power management unit 23 facing the receiving portion 2122. The socket 231 of the power management unit 23 can be electrically connected to the electrical connector 221 via the through-hole 2123 (as shown in FIG. 4), such that the power management unit 23 can be brought into electrical connection with the main control board 22.

In some embodiments, a flange 232 can be provided at each one of two opposite ends of the power management unit 23, the flanges 232 extending in the same direction. The two flanges 232 can be respectively mounted on two opposite sides of the receiving portion 2122 and detachably connected to the second cover 212. In some embodiments, a connecting hole 262, 292 and 273 can be provided at the flange 232, the second cover 212 and the first cover 211, respectively, the connecting holes 262, 292 and 273 corresponding to one another. The power management unit 23 can be fixedly connected to the second cover 212 and the first cover 211 by fitting a connecting piece 282 with the opposing connecting holes 262, 292 and 273, thereby preventing the power management unit 23 from vibrating on the housing 21 and reducing a risk of power interruption of an independent system. In some instances, the connecting holes 262, 292 and 273 can each be a threaded hole, and the connecting piece 282 can be a screw.

In an operation of the power management unit 23, significant amount of heat can be generated. A heat dissipation of the power management unit 23 can be facilitated by disposing the power management unit 23 on an exterior of the second cover 212. In addition, an influence of the heat on a performance of the main control board 22 and the inertial measurement unit 24 can be reduced, and a detachment and a maintenance of the power management unit 23 can be easy. For instance, the power management unit 23 can be easily replaced if a specification of the power management unit 23 is to be changed to expand the flight control device 20 additional functional modules.

In some embodiments, as shown in FIGS. 1-2, the flight control device 20 can further comprise an air guidance plate 213. The air guidance plate 213 can mate with the housing 21 and be detachably connected to the housing 21. In some embodiments, a recess 2130, which corresponds to the receiving portion 2122 of the housing 21, can be provided at the air guidance plate 213. The recess 2130 of the air guidance plate 213 can form an accommodating cavity together with the receiving portion 2122 of the second cover 212, such that the power management unit 23 is accommodated and fixed in the accommodating cavity to create an intact and aesthetic appearance of the flight control device 20.

A heat dissipation apparatus for dissipating a heat of the power management unit 23 can be provided to the air guidance plate 213 to facilitate a heat dissipation of the power management unit 23. In some embodiments, the heat dissipation apparatus can be an axial fan. The air guidance plate 213 can be provided with an air inlet 2131, a mounting hole 2132, a heat dissipation channel 2133 and an air outlet 2134 which are in communication with one another. The mounting hole 2132 can be used to mount the heat dissipation apparatus. The heat dissipation channel 2133 can run through the recess 2130 and communicate with the accommodating cavity. The air inlet 2131 and the air outlet 2134 can be respectively provided at two ends of the heat dissipation channel 2133.

In some embodiments, the air guidance plate 213 can serve as a carrier for hardware extensions. The configuration in which hardware extensions are provided on the air guidance plate 213 can be beneficial to reduce a volume of the flight control device 20 and effect a compact flight control device 20. It will be appreciated that, the air guidance plate 213 can be omitted in some embodiments.

In some embodiments, the electronic components supported on the main control board 22 can comprise at least one functional extension interface 222. The first cover 211 and/or the second cover 212 can be provided with an opening 2124 at a location corresponding to the at least one functional extension interface 222 to expose the functional extension interface 222. In some embodiments, the functional extension interface 222 can comprise at least one of an SD card slot, a USB interface or a VGA interface.

In the flight control device 20 of the disclosure, the main control board 22, the power management unit 23 and the inertial measurement unit 24 can be fixedly connected and integrated with the housing 21. As a result, the appearance of the flight control device 20 can be improved, and the structure of the flight control device 20 can be compact to effectively reduce a volume of the flight control device 20, thereby the flight control device 20 can be used in various applications. In addition, various redundant extension interfaces can be provided to improve a redundancy and extensibility of the flight control device 20. Furthermore, efforts in mounting and debugging the functional modules can be reduced, and the risk of disconnection or misconnection can be lowered, thereby improving the stability and reliability of the system. Last but not least, an independent system and a redundant system can be clearly distinguished by virtue of an improved recognizability of the system.

Figure 5:
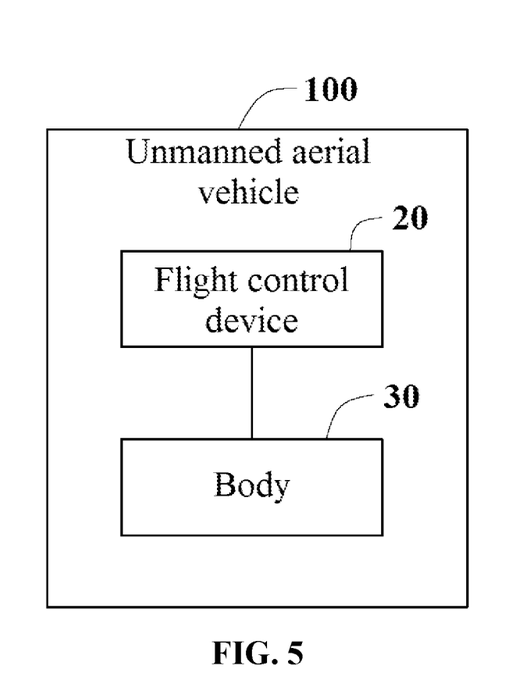
FIG. 5 is a schematic diagram of a configuration of an unmanned aerial vehicle (UAV) in accordance with embodiments of the disclosure.

In some embodiments, the flight control device 20 can be applied to an unmanned aerial vehicle (UAV) 100. As shown in FIG. 5, the unmanned aerial vehicle 100 can comprise a body 30 on which the flight control device 20 is mounted.

The embodiments as described hereinabove are intended to merely illustrate rather than limit the disclosure. While some embodiments of the disclosure are shown and described herein, numerous variations and substitutions will occur to those skilled in the art without departing from the scope of the disclosure.

What is claimed is:
1. A flight control device comprising:
a housing;
a main control board provided in the housing;
an inertial measurement unit provided in the housing and electrically connected to the main control board; and a power management unit provided at the housing and electrically connected to the main control board, wherein:
the main control board, the inertial measurement unit, and the power management unit are fixedly connected to and integrated with the housing as a whole; and
the housing includes a first cover and a second cover mating with and detachably connected to each other to form an accommodating cavity between the first cover and the second cover for accommodating the main control board and the inertial measurement unit, wherein:
the first cover includes a first mounting region and a second mounting region;
a shape of the first mounting region matches a shape of the main control board, and the main control board is fixed at the first mounting region; and
a shape of the second mounting region matches a shape of the inertial measurement unit, and the inertial measurement unit is provided at the second mounting region.

2. The flight control device of claim 1, wherein:
the first cover and the second cover each include a connecting hole, the connecting hole of the first cover corresponding to the connecting hole of the second cover, and the first cover and the second cover being fixed together through a connecting piece fitted with the connecting holes; or
the first cover and the second cover are fixed together through a snap fitting or an adhesive.

3. The flight control device of claim 1, wherein:
the first cover includes a stopper around the second mounting region to constrain the inertial measurement unit within the second mounting region;
one side of the second cover facing the first cover includes a receiving groove corresponding to the second mounting region; and
the receiving groove and the stopper together form a receiving cavity to receive and fix the inertial measurement unit.

4. The flight control device of claim 1, wherein the inertial measurement unit is electrically connected to the main control board through a flexible circuit board.

5. The flight control device of claim 1, wherein one side of the second cover that is distal from the first cover includes a receiving portion receiving the power management unit.

6. The flight control device of claim 5, further comprising:
an electrical connector supported by the main control board,
wherein:
the receiving portion includes a through-hole corresponding to the electrical connector,
the power management unit includes a socket on a side of the power management unit that faces the receiving portion, and
the socket is electrically connected to the electrical connector via the through-hole, such that the power management unit is in electrical connection with the main control board.

7. The flight control device of claim 5, wherein:
the power management unit includes two flanges provided at two opposite ends of the power management unit and mounted on two opposite sides of the receiving portion, respectively,
the two flanges extend in a same direction, and
the two flanges are detachably connected to the second cover.

8. The flight control device of claim 1, further comprising:
an air guidance plate including a heat dissipation channel, wherein the air guidance plate is mated with a surface of the housing and detachably connected to the housing.

9. The flight control device of claim 1, further comprising:
an electronic component supported by the main control board and including at least one functional extension interface,
wherein the housing includes the first cover and the second cover mating with and detachably connected to each other, at least one of the first cover or the second cover including an opening at a location corresponding to the at least one functional extension interface to expose the at least one functional extension interface.

10. The flight control device of claim 9, wherein the at least one functional extension interface includes at least one of an SD card slot, a USB interface, or a VGA interface.

11. A flight control device of claim 8, wherein comprising:
a housing;
a main control board provided in the housing;
an inertial measurement unit provided in the housing and electrically connected to the main control board;
a power management unit provided at the housing and electrically connected to the main control board; and
an air guidance plate including a heat dissipation channel, wherein:
the main control board, the inertial measurement unit, and the power management unit are fixedly connected to and integrated with the housing as a whole;
the housing includes a receiving portion for receiving the power management unit and provided on a surface of the housing;
the air guidance plate includes a recess corresponding to the receiving portion, and the air guidance plate is mated with the surface of the housing and detachably connected to the housing;
an accommodating cavity for accommodating the power management unit is formed by the recess and the receiving portion; and
the heat dissipation channel is in communication with the accommodating cavity.

12. The flight control device of claim 11, wherein the air guidance plate further includes a heat dissipation apparatus for dissipating heat of the power management unit.

13. The flight control device of claim 12, wherein:
the heat dissipation apparatus includes an axial fan,
the air guidance plate further includes an air inlet, a mounting hole, and an air outlet,
the air inlet, the mounting hole, the heat dissipation channel, and the air outlet are in communication with one another,
the heat dissipation apparatus is mounted through the mounting hole,
the heat dissipation channel runs through the recess, and
the air inlet and the air outlet are provided at two ends of the heat dissipation channel, respectively.

14. An unmanned aerial vehicle comprising:
a body; and
a flight control device mounted at the body, the flight control device including:
a housing;
a main control board provided in the housing;
an inertial measurement unit provided in the housing and electrically connected to the main control board; and a power management unit provided at the housing and electrically connected to the main control board, wherein:

the main control board, the inertial measurement unit, and the power management unit are fixedly connected to and integrated with the housing as a whole; and the housing includes a first cover and a second cover mating with and detachably connected to each other to form an accommodating cavity between the first cover and the second cover for accommodating the main control board and the inertial measurement unit, wherein:

the first cover includes a first mounting region and a second mounting region;

a shape of the first mounting region matches a shape of the main control board, and the main control board is fixed at the first mounting region; and a shape of the second mounting region matches a shape of the inertial measurement unit, and the inertial measurement unit is provided at the second mounting region.

\* \* \* \* \*